United States Patent
Lee

(10) Patent No.: US 8,741,772 B2
(45) Date of Patent: Jun. 3, 2014

(54) IN-SITU NITRIDE INITIATION LAYER FOR RRAM METAL OXIDE SWITCHING MATERIAL

(75) Inventor: Albert Lee, Cupertino, CA (US)

(73) Assignees: Intermolecular, Inc., San Jose, CA (US); Kabushiki Kaisha Toshiba, Tokyo (JP); SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 13/398,271

(22) Filed: Feb. 16, 2012

(65) Prior Publication Data

US 2013/0214231 A1    Aug. 22, 2013

(51) Int. Cl.
| | |
|---|---|
| H01L 21/4763 | (2006.01) |
| H01L 21/44 | (2006.01) |
| H01L 21/469 | (2006.01) |
| H01L 21/00 | (2006.01) |
| H01L 29/00 | (2006.01) |
| H01L 47/00 | (2006.01) |
| H01L 29/02 | (2006.01) |
| H01L 29/04 | (2006.01) |
| H01L 29/06 | (2006.01) |

(52) U.S. Cl.
USPC ........... 438/647; 438/674; 438/680; 438/784; 438/85; 257/1; 257/2; 257/3; 257/4; 257/5

(58) Field of Classification Search
USPC ............. 257/2, 4, E27.016, E27.015, E21.68, 257/E21.003; 438/3; 365/185.19, 63, 100, 365/131, 148
See application file for complete search history.

(56) References Cited

U.S. PATENT DOCUMENTS

| | | | |
|---|---|---|---|
| 7,335,569 B2 | 2/2008 | Senzaki | |
| 7,808,810 B2 | 10/2010 | Herner | |
| 7,816,659 B2 | 10/2010 | Herner et al. | |
| 7,829,875 B2 | 11/2010 | Scheuerlein | |
| 7,875,871 B2 | 1/2011 | Kumar et al. | |
| 2007/0108430 A1* | 5/2007 | Lung | 257/4 |
| 2007/0238311 A1* | 10/2007 | Levy | 438/765 |
| 2008/0116438 A1* | 5/2008 | Lee et al. | 257/2 |
| 2008/0128772 A1* | 6/2008 | Senzaki | 257/296 |
| 2009/0026434 A1* | 1/2009 | Malhotra et al. | 257/2 |
| 2009/0052226 A1* | 2/2009 | Lee et al. | 365/148 |
| 2009/0272959 A1* | 11/2009 | Phatak et al. | 257/2 |

OTHER PUBLICATIONS

Kim et al.; Anodeinterface localized filamentary mechanism in resistive switching of TiO2 thin films; Jul. 6, 2007; American Institute of Physics; Applied Physics Letters pp. 01290710129073 vol. 91.
Wang, Y., et al.; Characterization of UltraThin Hafnium Oxide Films Grown on Silicon by Atomic Layer Deposition Using Tetrakisethylmethylamino Hafnium and Water Precursors; Jan. 1, 2007; Sematech; Chem. Mater. pp. 31273138.

(Continued)

*Primary Examiner* — Steven Loke
*Assistant Examiner* — Juanita B Rhodes

(57) ABSTRACT

A resistive memory device having an in-situ nitride initiation layer is disclosed. The nitride initiation layer is formed above the first electrode, and the metal oxide switching layer is formed above the nitride initiation layer to prevent oxidation of the first electrode. The nitride initiation layer may be a metal nitride layer that is formed by atomic layer deposition in the same chamber in which the metal oxide switching layer is formed. The nitride initiation layer and metal oxide switching layer may alternatively be formed in a chemical vapor deposition (CVD) chamber or a physical vapor deposition (PVD) chamber.

13 Claims, 5 Drawing Sheets

(56) References Cited

OTHER PUBLICATIONS

Kim, K., et al.; Atomic Layer Deposition of Insulating Nitride Interfacial Layers for Germanium Metal Oxide Semiconductor Field Effect Transistors with Highk OxideTungsten Nitride Gate Stacks; May 21, 2007; Harvard, College (US) ; Applied Physics Letters pp. 9092.

Netzer, F.; Interfacial Oxide Layers at the MetalOxide Phase Boundary; Jan. 1, 2002; World Scientific Publishing Company; Surface Review and Letters vol. 9 Nos. 3 and 4 pp. 15531563.

Wang, X., et al.; Effect of Anodic Interface Layers on the Unipolar Switching of HfO2based Resistive RAM; Jan. 1, 2010; IEEE.

* cited by examiner

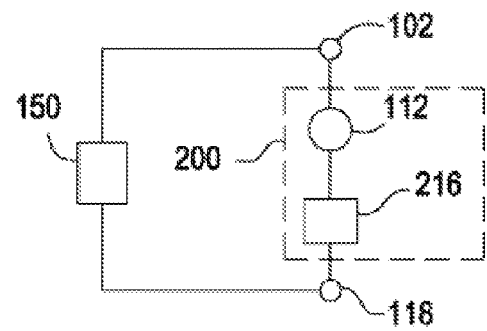 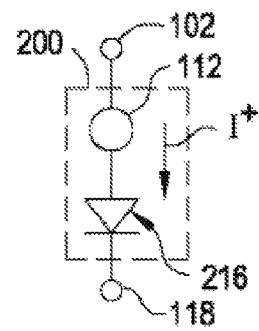
FIG. 2A      FIG. 2B
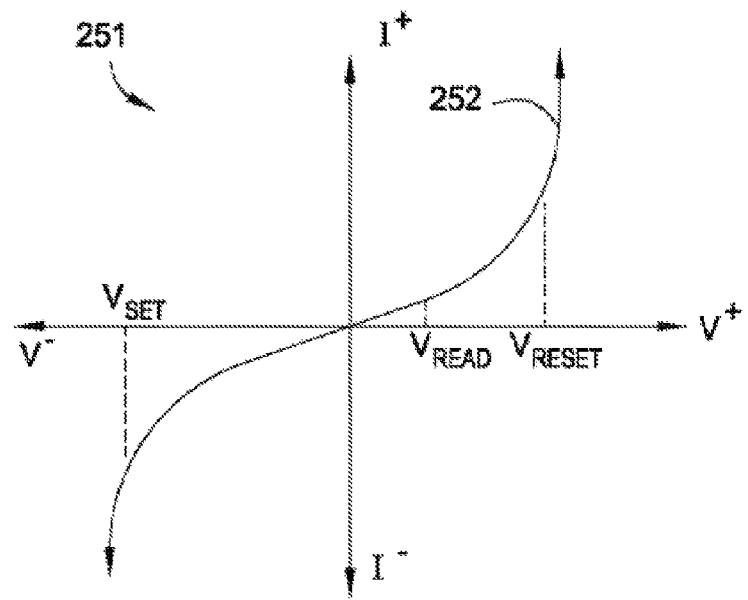
FIG. 2E

IN-SITU NITRIDE INITIATION LAYER FOR RRAM METAL OXIDE SWITCHING MATERIAL

TECHNICAL FIELD

The present disclosure relates generally to nonvolatile memory elements and in particular to nonvolatile memory elements having an in-situ nitride initiation layer formed between the bottom electrode and the metal oxide switching material and methods of making these nonvolatile memory elements.

BACKGROUND

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments.

Nonvolatile memory is often formed using electrically-erasable programmable read only memory (EEPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly smaller dimensions. However, as device dimensions shrink, scaling issues are posing challenges for traditional nonvolatile memory technology. This has led to the investigation of alternative nonvolatile memory technologies, including resistive switching nonvolatile memory.

Resistive switching nonvolatile memory is formed using memory elements that have two or more stable states with different resistances. Bistable memory has two stable states. A bistable memory element can be placed in a high resistance state or a low resistance state by application of suitable voltages or currents. Voltage pulses are typically used to switch the memory element from one resistance state to the other. Nondestructive read operations can be performed to ascertain the value of a data bit that is stored in a memory cell.

Resistive switching memory elements typically include multiple metal oxide and nitride films between two electrodes as a resistive switching layer. The films are typically deposited as a stack of films, and are sometimes deposited using atomic layer deposition (ALD) processes. These multiple metal oxide and nitride films exhibit bistability, and can be placed in the high resistance state or low resistance state by applying the suitable voltages or currents.

During deposition of the metal oxide film on the bottom electrode, the bottom electrode can become oxidized. In particular, oxidation typically occurs during the oxidizer pulse steps of the ALD process. This oxidation of the bottom electrode can affect the electrical performance of the device, and, in particular, it can alter the switching properties of the device. This can affect the required currents and voltages necessary to reliably set, reset and/or determine the desired "on" and "off" states of the device, increase the overall power consumption of the memory chip, increase resistive heating of the device and increase cross-talk between adjacent devices.

Prior art techniques for solving the oxidation problem have involved surface pre-treatments of the bottom electrode prior to the ALD metal oxide deposition to prevent oxidation of the bottom electrode before and during the ALD deposition. However, these pre-treatment techniques need to be done ex-situ (out of the deposition chamber), which is disadvantageous because oxide can re-grow from exposure to air, prior to ALD deposition. Further developments and improvements are needed.

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

According to one aspect of the present disclosure, a method of making a resistive memory device is provided that includes forming a first layer above an electrode of the resistive memory device, wherein the first layer includes metal nitride; and forming in situ a second layer above the first layer, wherein the second layer is a metal oxide switching layer.

The first layer and the second layer may be formed in an atomic layer deposition chamber. Forming the first layer may include using a nitrogen reactant, and forming the second layer may include using an oxidizer. Forming the first layer may include using a metal precursor and a nitrogen reactant, and forming the second layer may include using the metal precursor and an oxidizer. The nitrogen reactant may be ammonia.

The first layer and the second layer may be formed in a chemical vapor deposition chamber or atomic layer deposition chamber. The first layer and the second layer may be formed in a physical vapor deposition chamber.

The thickness of the first layer may be between about five and about ten Angstroms.

The electrode may be a first electrode and the method may further include forming the first electrode before forming the first layer; and forming a second electrode after forming the second layer.

A resistive memory device made by the above method is also disclosed.

According to another aspect of the present disclosure, a resistive memory device is provided that includes a first electrode; a first layer above the first electrode, the first layer including metal nitride; a second layer above the first layer, the second layer including a metal oxide; and a second electrode above the metal oxide layer. The thickness of the first layer may be between about five and about ten Angstroms.

According to a further aspect of the present disclosure, a method of making a resistive memory device is provided, the method characterized in that a nitride initiation layer is formed above a first electrode before forming a metal oxide layer in an atomic layer deposition chamber. The thickness of the nitride initiation layer may be between about five and about ten Angstroms. The nitride initiation layer may be formed using a nitrogen reactant and the metal oxide switching layer is formed using an oxidizer. The nitrogen reactant may be ammonia. The nitride initiation layer may be a metal nitride.

A resistive memory device made by the above method is also disclosed.

BRIEF DESCRIPTION OF THE DRAWINGS

The accompanying drawings, which are incorporated into and constitute a part of this specification, illustrate one or more examples of embodiments and, together with the description of example embodiments, serve to explain the principles and implementations of the embodiments.

FIG. 2A is schematic representation of a memory device in accordance with some embodiments of the present disclosure.

FIG. 2B is schematic representation of a memory device having a diode type current steering element in accordance with some embodiments of the present disclosure.

FIG. 2E is a graph illustrating the current (I) versus voltage (V) characteristics of a bipolar switching type memory element in accordance with some embodiments of the present disclosure.

DETAILED DESCRIPTION

Embodiments of the invention are directed to a resistive memory device having an in-situ nitride initiation layer. The nitride initiation layer is formed above the first electrode, and the metal oxide switching layer is formed above the nitride initiation layer to prevent oxidation of the first electrode. The nitride initiation layer may be a metal nitride layer that is formed by atomic layer deposition (ALD) in the same chamber in which the metal oxide switching layer is formed. It will be appreciated that the nitride initiation layer and metal oxide switching layer may alternatively be formed in a chemical vapor deposition (CVD) chamber or a physical vapor deposition (PVD) chamber.

Using a nitrogen reactant, such as $NH_3$, during the first few layers of ALD deposition forms a metal nitride layer that protects the bottom electrode from oxidation. After the first few layers of metal nitride deposition, the reactant is switched from nitrogen to the oxidizer to form the metal oxide during the remainder of the process. As explained above, this process may be performed in-situ (i.e., the metal nitride initial layer and the metal oxide layer can be formed using one process recipe in the same ALD chamber), without having exposure to ambient air between the nitride and oxide depositions. This provides improved switching performance by minimizing oxidation of the bottom electrode. In addition, by depositing the metal nitride layer in-situ with the metal oxide, the process is simple and does not require multiple chambers, avoiding problems associated with exposure of the device to oxygen, hydrocarbons, and the like, that affect the performance of the device.

Figure 1:
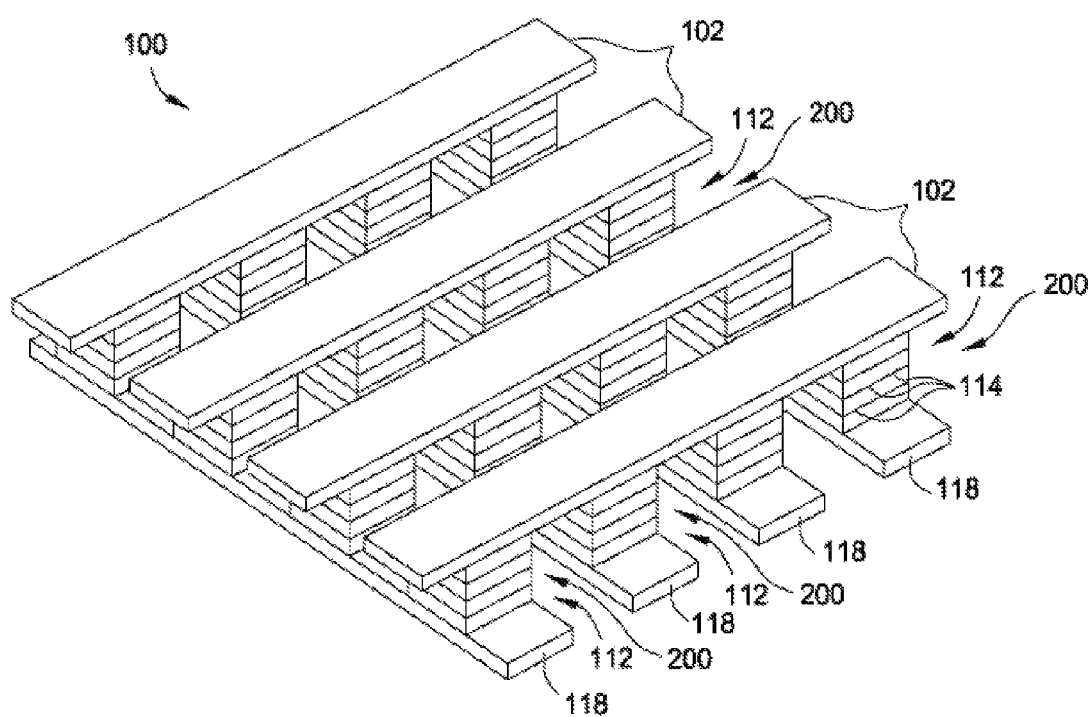
FIG. 1 illustrates an array of resistive switching memory elements in accordance with some embodiments of the present disclosure.

An illustrative memory array 100 of nonvolatile resistive switching memory devices 200 (hereafter switching memory device 200), which each generally include at least one resistive switching memory element 112, is illustrated in FIG. 1. Memory array 100 may be part of a larger memory device or other integrated circuit structure, such as a system on a chip type device. Read and write circuitry is connected to switching memory devices 200 using word-lines and orthogonal bit-lines, which are referred to herein generally as electrodes 102 and 118, and are used to read from or write data into the memory element 200. Electrodes 102 and 118 generally include one or more conductive layers that each have a desired function in the array of switching memory devices 200. In some configurations, the electrodes 102 and 118 each comprise two or more conductive layers in which a first conductive layer is used to interconnect the multiple switching memory devices 200 and a second conductive layer is disposed in each switching memory device 200 to provide a desirable electrical interface (e.g., desirable work function) to the adjacent components in the switching memory device 200. Individual switching memory devices 200 or groups of switching memory devices 200 can be accessed using appropriate sets of word-lines and bit lines, or electrodes 102 and 118. The memory elements 112 in the switching memory devices 200 may be formed from one or more layers 114 of materials, as indicated schematically in FIG. 1. In addition, memory arrays such as memory array 100 can be stacked in a vertical fashion to make multilayer memory array structures. The use of resistive switching memory elements to form memory arrays is merely illustrative, and one skilled in the art will appreciate that the formed devices may be used in other device applications without deviating from the basic scope of the invention described herein.

FIG. 2A schematically illustrates one example of a switching memory device 200 that contains a memory element 112 and an optional current steering device 216, which are both disposed between the electrodes 102 and 118. In one configuration, the current steering device 216 is an intervening electrical component, such as a p-n junction diode, p-i-n diode, transistor, or other similar device that is disposed between electrode 102 and memory element 112, or between the electrode 118 and memory element 112. In one example, the current steering device 216 may include two or more layers of semiconductor material, such as two or more doped silicon layers, that are configured to allow or inhibit the current flow in different directions through the memory element 112 when that memory element is not selected to read.

FIG. 2B schematically illustrates a switching memory device 200 that contains a memory element 112 and a diode type current steering device 216 that preferentially allows current to flow through the memory device 200 in a forward direction ("I+"). However, due to the design of the current steering device 216, a reduced current can also flow in the opposing direction through the device by the application of a reverse bias to the electrodes 102 and 118.

Figure 2C:
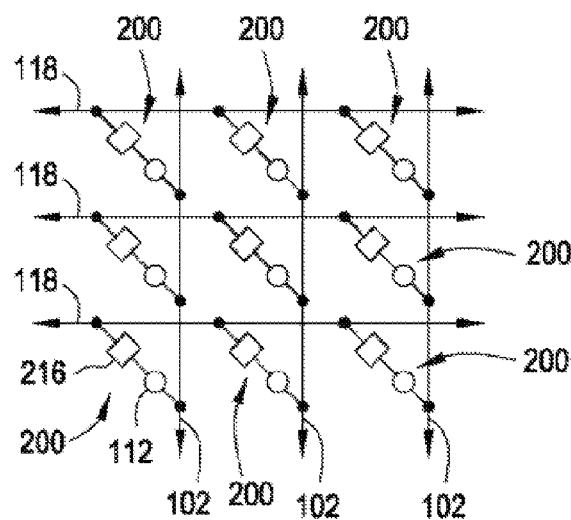
FIG. 2C is schematic representation of an array of memory devices in accordance with some embodiments of the present disclosure.

FIG. 2C schematically illustrates an array of switching memory devices 200 that are connected together to form part of a high-capacity nonvolatile memory integrated circuit. Each of the individual switching memory devices 200 can be accessed using appropriate sets of discrete word-lines and bit-lines, which, as noted above, may comprise at least a portion of the electrodes 102 and 118. As illustrated in FIG. 2C, each of the switching memory devices 200 contains a memory element 112 and current steering device 216 (e.g., a diode type) that are connected to at least one of the electrodes 102 and at least one of the electrodes 118. The electrodes 102 and/or 118 are generally biased by circuitry that is connected at the periphery of the memory chip on which the array of memory devices 200 is formed.

Figure 2D:
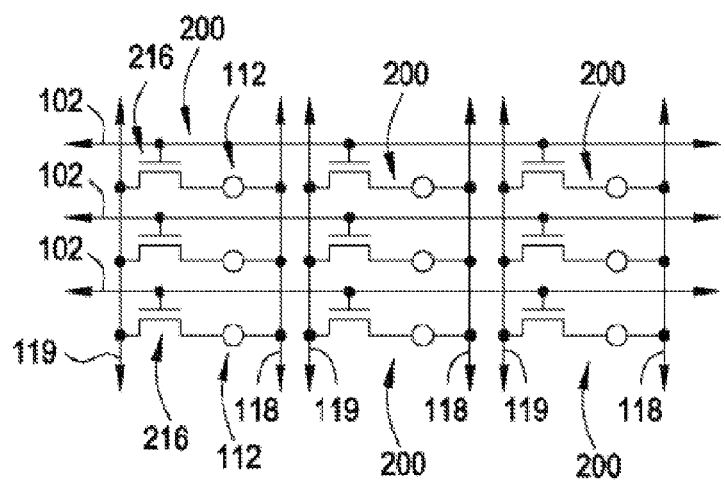
FIG. 2D is schematic representation of an array of memory devices in accordance with some embodiments of the present disclosure.

FIG. 2D schematically illustrates another embodiment of an array of switching memory devices 200 that are connected together to form part of a high-capacity nonvolatile memory integrated circuit. As shown in FIG. 2D, the current steering device 216, such as a typical MOS type transistor, is used to selectively deliver current through the memory element 112 by use of the appropriate set of word-lines, bit-lines and separate source-lines 119. As illustrated in FIG. 2D, each of the switching memory devices 200 contains a memory element 112 and current steering device 216 (e.g., transistor) that are connected to at least one of the electrodes 102, at least one of the electrodes 118 and at least one of the source lines 119. The source-lines 119 generally comprise one or more patterned conductive layers (e.g., metal) that are adapted provide a desired amount of current to the memory element 112 when the transistor in the current steering device is turned "on". The electrodes 102, electrodes 118 and source-lines 119 are typically biased by circuitry that is connected at the periphery of the memory chip on which the array of memory devices 200 is formed.

During operation, such as a read operation, the state of a memory element 112 in the switching memory device 200 can be sensed by applying a sensing voltage (i.e., a "read" voltage $V_{READ}$ (FIG. 2E)), such as applying about +0.5 volts (V), to an appropriate set of electrodes 102 and 118. Depending on its history, a memory element that is addressed in this way may be in either a high resistance state (HRS) or a low resistance state (LRS). The resistance of the memory element 112 therefore determines what digital data is being stored by the memory element 112. If the memory element 112 is in the high resistance state, for example, the memory element may be said to contain a logic "one" (i.e., a "1" bit). If, on the other hand, the memory element is in the low resistance state, the memory element may be said to contain a logic "zero" (i.e., a "0" bit). During a write operation, the state of a memory element can be changed by application of suitable write signals to an appropriate set of electrodes 102 and 118.

In some embodiments, the memory element 112 uses bipolar switching where opposite polarity set and reset voltages are used to alter the resistance of the memory element between high and low resistance states. FIG. 2E schematically illustrates a log-log plot of current (I) versus voltage (V) (e.g., reference numeral 251) of one example of a bipolar switching curve 252 of a resistive switching type of memory element, and thus illustrates typical threshold values used to set and reset the contents of a memory element 112. In one example, initially, memory element 112 may be in a high resistance state (e.g., storing a logic "zero"). The high resistance state of memory element 112 can be sensed by read and write circuitry 150 (FIG. 2A) using electrodes 102 and 118. For example, read and write circuitry may apply a read voltage $V_{READ}$ to memory element 112, and can sense the resulting "off" current ($I_{OFF}$) that flows through memory element 112. When it is desired to store a logic "one" in memory element 112, memory element 112 can be placed into its low-resistance state. This may be accomplished by using read and write circuitry 150 to apply a set voltage $V_{SET}$ (e.g., −2 V to −4 V) across electrodes 102 and 118. In one configuration, applying a negative $V_{SET}$ voltage to memory element 112 causes memory element 112 to switch to its low resistance state. It is believed that the change in the resistive state of memory element 112 may be due to the redistribution or filling of traps (i.e., "trap-mediated"), or defects, in the resistive switching layer, or variable resistance layer 316 (FIG. 3), when the device is reverse biased. The defects or traps, which are commonly formed during the deposition or initial burn-in or forming of the variable resistance layer 316, are often created by a non-stoichiometric material composition found in the formed variable resistance layer 316. $V_{SET}$ and $V_{RESET}$ are generally referred to as "switching voltages" herein.

The low resistance state of the memory element 112 can be sensed using the read and write circuitry 150. When a read voltage $V_{READ}$ is applied to resistive switching memory element 112, the read and write circuitry 150 will sense the relatively high "on" current value ($I_{ON}$), indicating that memory element 112 is in its low resistance state. When it is desired to store a logic "zero" in memory element 112, the memory element can once again be placed in its high resistance state by applying a positive reset voltage $V_{RESET}$ (e.g., +2 V to +5 V) to memory element 112. When read and write circuitry applies $V_{RESET}$ to memory element 112, memory element 112 enters its high resistance state. When the reset voltage $V_{RESET}$ is removed from memory element 112, memory element 112 will once again be characterized by high resistance when the read voltage $V_{READ}$ is applied. Voltage pulses can be used in the programming of the memory element 112. For example, a 1 microseconds (ms) to 1 nanoseconds (ns) square or trapezoidal shaped pulse can be used to switch the memory element 112. In some embodiments, it may be desirable to adjust the length of the pulse depending on the amount of time needed to switch the memory element 112. In one example, the "set" and "reset" pulses are each about 10 ns in length. While the discussion of the memory element 112 herein primarily provides bipolar switching examples, some embodiments of the memory element 112 may use unipolar switching, where the set and reset voltages have the same polarity, without deviating from the scope of the invention described herein.

To provide a measurable difference between the logic "zero" and logic "one" states is common to form the variable resistance layer 316 and other memory element 112 components so that the difference between the $I_{ON}$ and $I_{OFF}$ currents have a difference of at least one order of magnitude (e.g., current ratio $I_{ON}/I_{OFF} \sim 10$). In other words, the ratio of the electrical resistances of the variable resistance layer 316 is decreased by at least 10 times when switching between the high and the low resistance states.

In an effort to prepare the memory element 112 for use, it is common to apply a forming voltage ($V_{FORM}$) at least once across the electrodes 102, 118 to "burn-in" the device. It is believed that the application of a forming voltage, which is typically significantly greater than the $V_{RESET}$ and $V_{SET}$ voltages, causes the defects that are formed within the variable resistance layer 316 during the device fabrication process to move, align and/or collect within various regions of the formed layer, causing the variable resistance layer 316 to consistently and reliably switch between the "on" and "off" resistive states throughout the memory element's life. In one configuration, the forming voltage is between about 1 and about 5 times greater than the $V_{RESET}$ or $V_{SET}$ voltage. In one example, the forming voltage is between about 1.4 and about 2.5 times greater than the $V_{RESET}$ or $V_{SET}$ voltage. In one example, the forming voltage is between about 3 and about 7 volts. However, it is noted that in some cases it is desirable to form the memory element 112 so that the application of a forming voltage is not required at all to assure that the device will perform as desired throughout its life.

Figure 3:
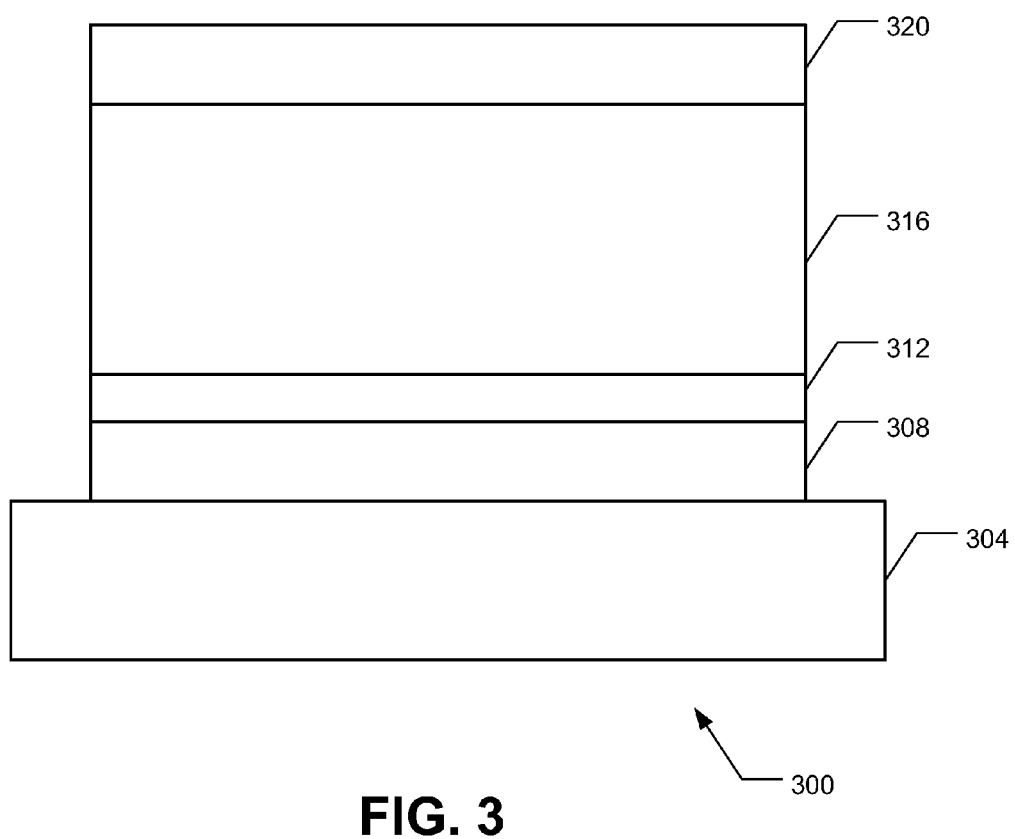
FIG. 3 is a schematic diagram of a memory device in accordance with some embodiments of the present disclosure.

As described above embodiments of the present disclosure are directed to the formation of the memory elements 112 in a single chamber. In some embodiments, the single chamber is an atomic layer deposition (ALD) chamber. In some embodiments, the memory elements 112 include a nitride layer between the bottom electrode and the metal oxide switching layer to protect the bottom electrode from oxidation. FIG. 3 illustrates exemplary resistive memory element formed according to embodiments of the present disclosure.

As shown in FIG. 3, the memory element 300 includes multiple layers formed above a base or substrate 304. The layers include a first electrode 308, a first layer 312, a second layer 316 and a second electrode 320. The memory element 300 can be used as one or more of the memory elements 112 of the switching memory devices 200.

The electrodes 308, 320 are formed from a conductive material. In some embodiments, the electrodes 308, 320 are formed from different materials, while, in other embodiments, the electrodes 308, 320 are formed from the same material. The electrodes 308, 320 may be formed, for example, from p-type polysilicon, n-type polysilicon, transition metals, transition metal alloys, transition metal nitrides and transition metal carbides. The thickness of the electrodes may be any value or range of values between about 50 Å and about 5000 Å. It will be appreciated that the thickness of the electrodes may be less than 50 or more than 5000 angstroms (Å).

The second layer 316 may be the resistive switching layer. The second layer 316 is typically formed of a dielectric material. In some embodiments, the resistive switching layer is a metal oxide or other similar material. In some embodiments, the second layer 316 is formed using an oxidation process in an atomic layer deposition (ALD) chamber. The thickness of the second layer may be any value or range of values between about 10 and about 100 angstroms (Å), and in some embodiments, between about 30 and about 50 angstroms (Å). It will be appreciated that the thickness of the second layer may be less than 10 or more than 100 angstroms (Å).

The first layer 312 protects the bottom electrode 308 from oxidation during formation of the second layer 316. In some embodiments, the first layer 312 comprises nitride, and, in particular, in some embodiments, the first layer 312 is a metal nitride. The first layer 312 is formed in the same chamber as the second layer 316 (i.e., formed in-situ). In some embodiments, the first layer 312 is formed in an atomic layer deposition (ALD) chamber. The thickness of the first layer may be any value or range of values between about 5 and about 10 angstroms (Å). It will be appreciated that the thickness of the first layer may be less than 5 or more than 10 angstroms (Å).

It will be appreciated that the metal used in the electrodes 308, 320, first layer 312 and/or second layer 316 may include titanium (Ti), tungsten (W), tantalum (Ta), cobalt (Go), molybdenum (Mo), nickel (Ni), vanadium (V), hafnium (Hf) aluminum (Al), copper (Cu), platinum (Pt), palladium (Pd), iridium (Ir), ruthenium (Ru), and the like, alloys thereof, and combination thereof. In some embodiments, each of the electrodes 308, 320, first layer 312 and second layer 316 are made using the same metal. In other embodiments, one or more of the electrodes 308, 312, first layer 316 and second layer 320 may be made using different metals.

Figure 4:
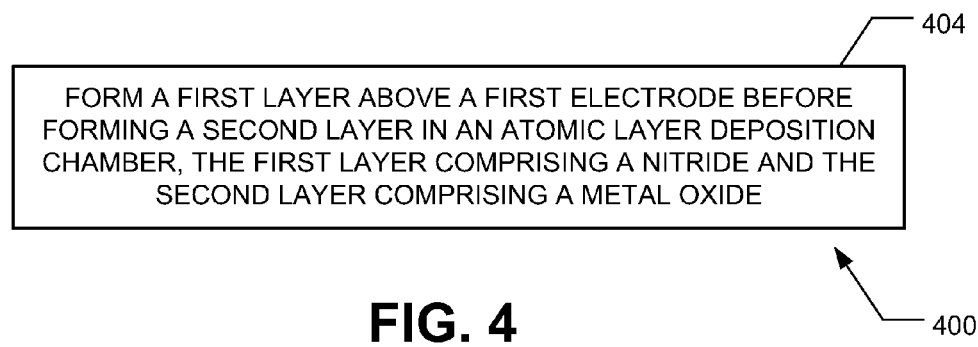
FIG. 4 is a flow diagram showing a method of making a memory device in accordance with some embodiments of the present disclosure.

FIG. 4 illustrates a method for making a memory element 400 (e.g., memory element 300) according to some embodiments of the present disclosure. As shown in FIG. 4, the method 400 includes forming a first layer above a first electrode before forming a second layer in an atomic layer deposition chamber at step 404. The first layer may include a nitride (e.g., a metal nitride), and the second layer may include a metal oxide.

It will be appreciated that, in other embodiments, the first and second layers can be deposited using a CVD chamber (including LPCVD, PECVD, MOCVD, and the like), physical vapor deposition (PVD) chamber, a liquid deposition chamber, and the like.

Figure 5:
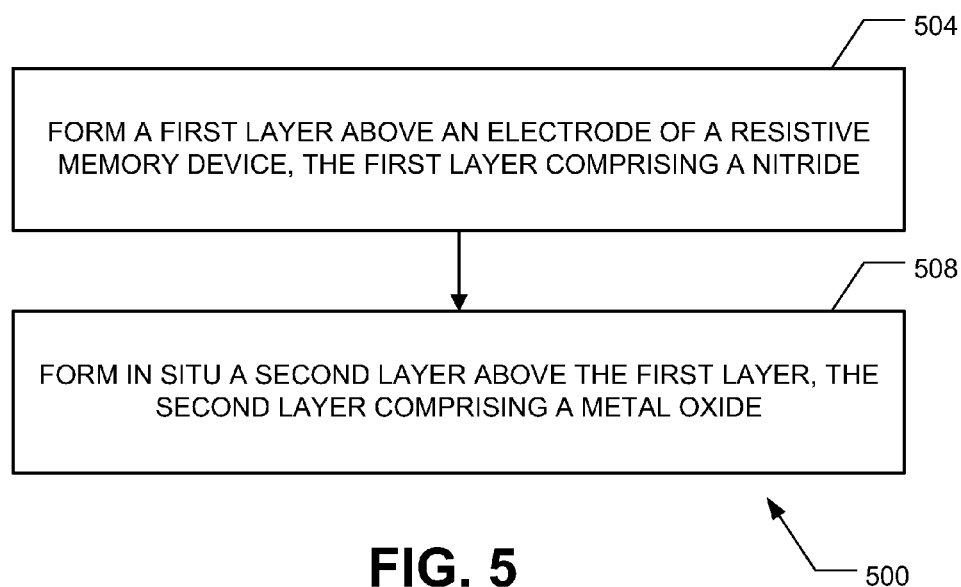
FIG. 5 is a flow diagram showing a method of making a memory device in accordance with some embodiments of the present disclosure.

FIG. 5 illustrates a more detailed method for making a memory element 500 (e.g., memory element 300) according to some embodiments of the present disclosure. As shown in FIG. 5, the method 500 begins by forming a first layer above an electrode of a resistive memory device at step 504. The first layer may be a metal nitride layer (e.g., first layer 312). In some embodiments, the first layer is formed using a metal precursor and a nitrogen reactant in a deposition chamber. In some embodiments, the first layer may be a nitride layer, and the first layer is formed using a nitrogen reactant in a deposition chamber. In some embodiments, the nitrogen reactant is ammonia ($NH_3$). In some embodiments, the metal precursor and the nitrogen reactant are introduced into the chamber during the formation of the first few ALD layers (e.g., the first five to ten layers).

The method 500 continues by forming a second layer above the first layer in situ at step 508. The second layer may be a metal oxide layer (e.g., second layer 316). After the deposition of the first layer, the reactant is switched from nitrogen to the oxidizer to form the metal oxide. In some embodiments, the metal precursor is the same during both steps 504 and 508.

Forming the second layer in-situ means that each of the steps of the method 500 are performed in a single deposition chamber, as described above with reference to FIG. 4.

It will be appreciated that the method 500 may also include additional steps. For example, the method 500 may also include forming the electrodes, which may be formed in the same deposition chamber or in different deposition chambers.

Embodiments of the present disclosure are advantageous because the first layer (e.g., the nitride layer between the bottom electrode and the resistive switching layer) protects the bottom electrode from oxidation. Because the steps are performed in-situ, the device is not exposed to ambient air between the nitride and oxide depositions. This provides improved switching performance because oxidation of the bottom electrode is minimized. In addition, by depositing the metal nitride layer in-situ with the metal oxide, the process is simple and does not require multiple chambers, avoiding problems associated with exposure of the device to oxygen, hydrocarbons, and the like, that affect the performance of the device (i.e., providing improved switching performance).

The present disclosure has been described in relation to particular examples, which are intended in all respects to be illustrative rather than restrictive. Various aspects and/or components of the described embodiments may be used singly or in any combination. It is intended that the specification and examples be considered as exemplary only, with a true scope and spirit of the invention being indicated by the claims.

What is claimed is:

1. A method of making a resistive memory device, the method comprising:
    forming a first layer above an electrode,
        wherein the electrode comprises a first metal nitride,
        wherein the first layer is operable to reduce oxidation of the electrode and comprises a second metal nitride,
        wherein the second metal nitride comprises hafnium nitride,
        wherein the first layer directly contacts the electrode; and
    forming in situ a second layer above the first layer using the same process recipe as the first layer,
        wherein the second layer is operable as a resistive switching layer and comprises a metal oxide having a metal common to the first layer, wherein the metal oxide is hafnium oxide, wherein the second layer directly contacts the first layer, and wherein the in situ forming of the second layer reduces oxidation of the electrode.

2. The method of claim 1, wherein the first layer and the second layer are formed in an atomic layer deposition chamber.

3. The method of claim 2, wherein forming the first layer comprises using a nitrogen reactant, and wherein forming the second layer comprises using an oxidizer.

4. The method of claim 2, wherein forming the first layer comprises using a metal precursor and a nitrogen reactant, and wherein forming the second layer comprises using the metal precursor and an oxidizer.

5. The method of claim 3, wherein the nitrogen reactant comprises ammonia.

6. The method of claim 1, wherein the first layer and the second layer are formed in a chemical vapor deposition chamber.

7. The method of claim 1, wherein the first layer and the second layer are formed in a physical vapor deposition chamber.

8. The method of claim 1, wherein a thickness of the first layer is between about 5 Angstroms and about 10 Angstroms.

9. The method of claim 1, wherein the electrode is a first electrode and further comprising:

forming the first electrode before forming the first layer; and forming a second electrode after forming the second layer.

10. The method of claim 4, wherein changing from forming the first layer to forming the second layer comprises switching from the nitrogen reactant to the oxidizer supplied into a deposition chamber.

11. The method of claim 1, wherein the electrode comprises a first conductive layer and a second conductive layer, the first conductive layer interconnecting the resistive memory device with another resistive memory device, the second conductive layer interfacing the first layer and having a predetermined work function.

12. The method of claim 1, wherein the electrode has a thickness of between about 50 Angstroms and 5000 Angstroms.

13. The method of claim 1, wherein the second layer has a thickness of between about 10 Angstroms and 100 Angstroms.

* * * * *